United States Patent

[11] 3,611,175

[72] Inventor Gilbert L. Boelke
West Seneca, N.Y.
[21] Appl. No. 22,839
[22] Filed Mar. 26, 1970
[45] Patented Oct. 5, 1971
[73] Assignee Sylvania Electric Products Inc.

[54] SEARCH CIRCUIT FOR FREQUENCY SYNTHESIZER
13 Claims, 5 Drawing Figs.

[52] U.S. Cl. .......... 331/4, 331/1 A, 331/11, 331/17, 331/25
[51] Int. Cl. .......... H03b 3/04
[50] Field of Search .......... 331/1 A, 4, 10, 11, 17, 18, 25

[56] References Cited
UNITED STATES PATENTS
3,328,719 6/1967 DeLisle et al. .......... 331/17
3,401,353 9/1968 Hughes .......... 331/18 X

*Primary Examiner*—Roy Lake
*Assistant Examiner*—Siegfried H. Grimm
*Attorneys*—Norman J. O'Malley, Elmer J. Nealon and Edward J. Coleman

ABSTRACT: In an indirect digital frequency synthesizer comprising a voltage-controlled oscillator, a feedback loop connected from the oscillator output to its phase control input via a frequency divider, phase detector and low-pass filter, a reference frequency pulse source connected as a second input to the phase detector, and a digital comparator network for comparing the frequency of the feedback and reference pulses and generating output pulses when the feedback and reference pulses are not interlaced, a search circuit responsive to the frequency comparator output pulses for providing an error correction signal to the oscillator, whereby the oscillator is coarse tuned to within a frequency allowing the phase detector to accomplish phase lock of the feedback pulse train with the reference pulse train. For bidirectional tuning, two outputs are taken from the comparator, pulses at one output indicating the feedback frequency is too low and pulses at the other output indicating the feedback frequency is too high, and the search circuit comprises a capacitor having two pulse-controlled constant current sources, one responsive to pulses at one of the comparator outputs for charging the capacitor in a stepwise manner and the other responsive to pulses at the second comparator output for providing stepwise discharging of the capacitor. For unidirectional tuning, only one pulse output is taken from the comparator, and the search circuit comprises a capacitor having a pulse-controlled constant current source operative in response to comparator output pulses to stepwise charge the capacitor, with a dump circuit being provided to discharge the capacitor upon its charging to a predetermined maximum voltage level.

INVENTOR
Gilbert L. Boelke
BY Edward J. Coleman
AGENT.

INVENTOR.
Gilbert L. Boelke
BY Edward J. Coleman
AGENT.

SEARCH CIRCUIT FOR FREQUENCY SYNTHESIZER

BACKGROUND OF THE INVENTION

This invention relates in general to frequency control circuits and in particular to an improved search circuit for use in coarse tuning an indirect frequency synthesizer.

A typical indirect digital frequency synthesizer comprises a voltage-controlled oscillator (VCO) adapted to be controlled in phase and frequency, a digital phase detector, a variable frequency divider in a feedback path from the oscillator output to one input of the phase detector, a reference frequency signal source connected to the other input of the phase detector, and a low-pass filter connected between the phase detector output and the control element of the oscillator. If there is a phase difference between the reference signal pulse train and the feedback signal pulse train from the divider, the phase detector generates an error signal which is supplied via the low-pass filter to phase correct the oscillator to achieve phase lock with the reference signal. Different output frequencies are selected by changing the feedback path frequency division ratio.

In addition to the above-mentioned elements, the synthesizer requires some means to coarse tune the frequency of the voltage-controlled oscillator to within a range that will allow the phase detector to pull the system into phase lock. One conventional coarse tuning technique has been to employ a manually adjusted resistor matrix composed of highly accurate components to provide a frequency error correction voltage to the oscillator control element. Because of the high cost of the accurate matrix components and the need in certain applications for a VCO which is highly stable in all environmental conditions, the manually adjusted resistor matrix has been replaced in many instances by an automatic coarse tuning system which usually takes the form of a digital frequency control loop. Automatic coarse tuning counteracts any drift in the initially established frequency position which would cause the VCO frequency to fall outside the capture range of the loop. Further, automatic coarse tuning precludes a false-lock condition whereby the VCO locks up to an undesired frequency which produces a phase detector output which is the same or similar to the error signal output produced at the desired frequency.

A prior art automatic coarse tuning system of particular interest is described in U.S. Pat. No. 3,401,353, assigned to the assignee of the present application. In this case, the coarse tuning system comprises a digital frequency comparator, functioning as a frequency lock detectors and a search circuit, comprising a binary ripple counter and a digital-to-analog converter, for providing an error correction signal to the oscillator. The feedback signal pulse train and the reference signal pulse train are applied as inputs to the frequency comparator, and the pulse drive input of the binary ripple counter is connected to the output of the comparator. The digital to analog converter is driven by the counter output to generate a set of voltage levels each corresponding to the digital number stored in the counter at that instant in time. These voltage levels are than applied as the frequency error correction signal for the synthesizer voltage-controlled oscillator.

The binary ripple counter is unidirectional, so that when continuously driven by output pulses from the comparator it causes the digital-to-analog converter to generate a cyclic staircase waveform. The number of voltage level increments comprising each cycle is determined by the length of the binary counter, and the amplitude of this staircase waveform determines the frequency tuning range of the system.

The digital comparator comprises a pair of pulse generators, one being driven by the reference signal pulse train and the other being driven by the feedback signal. Each of the pulse generators produces a pair of oppositely polarized output pulses in response to each input drive pulse. A pair of flip-flops is controlled by the pulse generator output pulses, and a pair of AND gates are respectively connected to the outputs of the pulse generators and respectively controlled by the flip-flops. An OR gate is then used to combine the AND gate outputs into a single comparator output. This prior art coarse tuning system is intended for use with a synthesizer phase detector which operates in the phase lock mode to steer the voltage-controlled oscillator toward a condition wherein the feedback and reference pulses are interlaced in time in an alternating one-to-one manner. Consequently, the digital comparator operates to generate output pulses when the feedback and reference pulses are not so interlaced and to provide no pulse output when the feedback and reference signals are interlaced in this manner.

Although the above-described prior art system provides a number of significant advantages, as described in the patent, it is desirable in many applications to provide a search circuit which employs fewer parts and is much more economical than the aforementioned ripple counter and digital-to-analog converter combination. In addition, there are a number of applications in which it is desirable to provide a simplified means of bidirectional coarse tuning to thereby provide faster lockup than is obtainable with a unidirectional tuning system.

SUMMARY OF THE INVENTION

Accordingly, it is an object of the present invention to provide an improved search circuit for use in the tuning system of an oscillator adapted to be controlled in frequency by a signal applied thereto.

Another object of the invention is to provide a simplified and more economical search circuit responsive to the pulse output of a digital frequency comparator for providing an error correction signal to the oscillator of an indirect frequency synthesizer.

Briefly, these objects are attained in an oscillator tuning system which includes a frequency comparator, means for coupling a feedback signal from the output of the oscillator to a first input of the comparator, and means for applying a reference signal to a second input of the comparator, the comparator being operative to generate output pulses when the feedback and reference signals have different frequencies. According to one aspect of the invention, this tuning system includes a search circuit for providing a control signal to the oscillator in response to the output of the frequency comparator. The search circuit basically comprises a charge storage means, a current source connected to the storage means and adapted to be activated by and for the duration of each pulse applied thereto, means for coupling output pulses from the comparator to the current source, and means for coupling the storage means to the oscillator whereby the stored charge functions as a control signal for the oscillator.

In one particular aspect of the invention, the aforementioned current source is operative when activated to increase the charge on the storage means, and the search circuit further includes means for detecting a predetermined maximum charge level in the storage means and producing an output signal indicative of a charge exceeding the maximum level. A dump circuit connected to the storage means is then operative to discharge the storage means in response to a charge exceedence output signal from the detecting means. In this manner, unidirectional tuning of the oscillator is provided.

In another particular aspect of the invention, the aforementioned frequency comparator has two outputs and is operative to generate pulses at one of its outputs when the feedback signal frequency is higher than the reference signal frequency, and to generate pulses at its other output when the feedback signal frequency is lower than the reference signal frequency. The aforementioned current source is connected to only one of the comparator output terminals and is operative when activated to increase the charge on the storage means. This embodiment further includes a second pulse-controlled current source connected to the storage means and coupled to the other output of the comparator. The second current source is operative when activated by a comparator output pulse to discharge the storage means. In this manner, bidirectional tuning of the oscillator is provided.

BRIEF DESCRIPTION OF THE DRAWINGS

This invention will be more fully described hereinafter in conjunction with the accompanying drawings, in which.

DESCRIPTION OF PREFERRED EMBODIMENT

For a better understanding of the present invention together with other and further objects, advantages and capabilities thereof, reference is made to the following disclosure and appended claims in connection with the above-described drawings.

Figure 1:
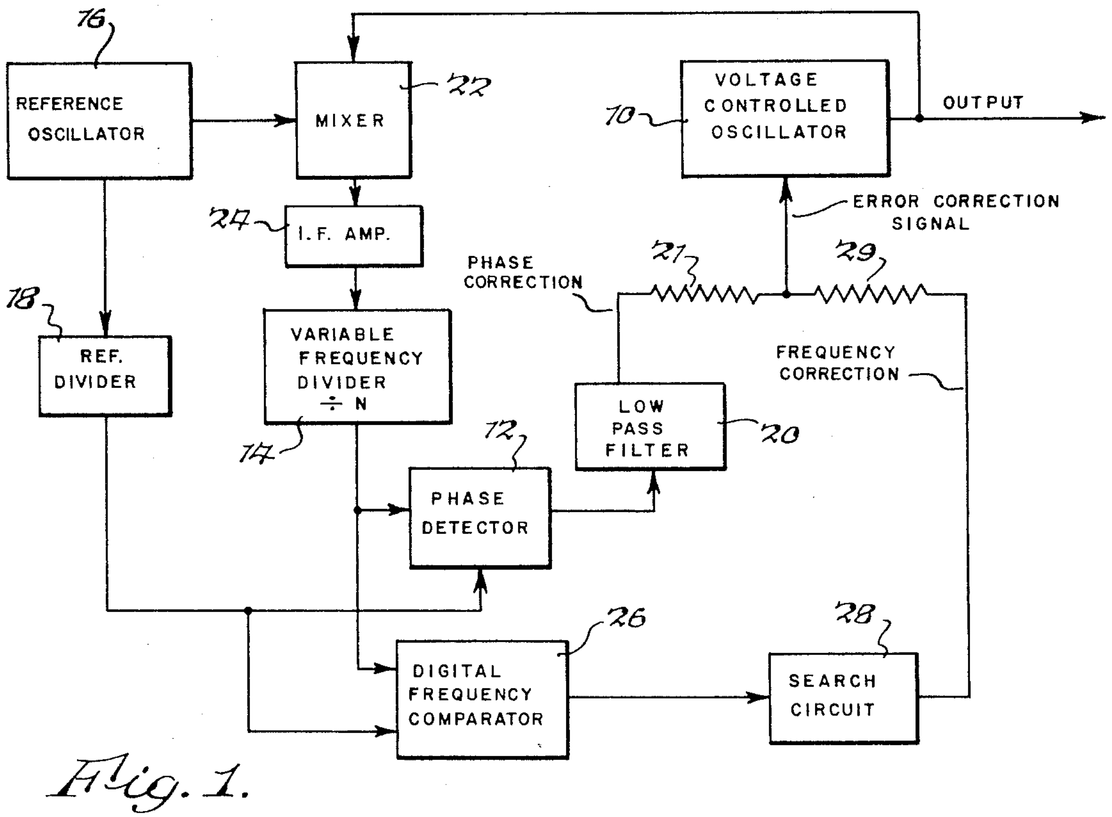
FIG. 1 is a block diagram of an indirect frequency synthesizer having a coarse tuning system which includes a search circuit to which the invention pertains.

FIG. 1 shows an indirect frequency synthesizer which provides a typical application of the search circuit of the invention. The synthesizer comprises a voltage-controlled oscillator (VCO) 10 adapted to be controlled in phase and frequency, a phase detector 12, a variable frequency divider 14 (N) connected in the feedback path from the oscillator output to one input of the phase detector, a reference frequency signal source consisting of an oscillator 16 and divider 18 which is connected to the other input of phase detector 12, and a low-pass filter 20 connected between the phase detector output and the control element of the oscillator, which for example may comprise a varactor circuit. More specifically, filter 20 is shown connected to oscillator 10 through a resistor 21, which forms one arm of a voltage-summing network to be discussed hereinafter. In this instance, the feedback signal from the VCO is down converted prior to application to the variable frequency divider 14. In particular, the VCO output is connected to a mixer 22 along with the output of reference oscillator 16. The frequency difference between the reference oscillator and VCO feedback signals is then coupled to divider 14 through a relatively narrow-band intermediate frequency (IF) amplifier 24. The IF amplifier is designed to produce a square wave output suitable to drive variable divider 14, which may comprise a binary ripple counter. The speed of operation of the counter is determined by the frequency of the signal applied thereto from mixer 22 and the bandwidth of the IF amplifier 24; the channel selection capability is determined by the length of the counter, i.e. the number of bistable stages which comprise the divider ripple counter. The down converted and divided pulse train output of circuit 14 is then applied as the feedback signal to phase detector 12. The reference divider 18 may also comprise a binary ripple counter, in which case it is driven by a pulse train from reference oscillator 16.

Phase detector 12 is preferably of the commonly employed digital type which corrects the VCO toward a settled phase lock mode wherein the feedback pulses are interlaced in time with the reference pulses in an alternating one-to-one manner. A preferred phase detector for use in this application is the sample and hold type in which the reference signal pulse train is converted to a sawtooth, or ramp, waveform which is applied to a series switch periodically sampled by the feedback pulse train. A "holding" capacitor is connected at the output of the series switch for storing the sampled ramp values. If there is no change in relative phase at successive sampling times, the output of the phase detector will not change. If, however, there is a phase difference between samples, the output capacitor voltage shifts abruptly up or down to the new value. It can be seen that as long as the two signals are in phase lock, the output ripple is ideally zero.

When the phase control loop of FIG. 1 is phase locked, the frequency of the feedback signal applied to the phase detector is equal to the reference frequency provided by divider 18. The variable divider 14 divides the intermediate frequency from mixer 22 by a number N; thus, the output of mixer 22 must be N times the reference frequency in order for the feedback frequency to be equal to the reference frequency. Consequently, the frequency of the VCO less the frequency of reference oscillator 16 (i.e. the intermediate frequency from mixer 22) can be set to any multiple of the reference frequency from divider 18 by changing the division ratio of divider 14. If there is a phase difference between the reference and feedback signals, the phase detector generates a proportional direct current control voltage which is applied via low-pass filter 20 as a phase error correction signal to the VCO to steer it towards the phase-locked condition and the desired synthesizer frequency output.

In order to provide for wide frequency excursions which take the VCO out of its capture range due to a required change in frequency by the operator or because of changes in the VCO components as a result of environment, an automatic coarse tuning system is included in the synthesizer to steer the VCO frequency to within a range that will allow the phase detector to pull the system into phase lock. The typical coarse tuning system comprises a digital frequency comparator 26 having a first input connected to the feedback signal output of the variable divider 14, and a second input connected to the reference signal output of divider 18. The output of comparator 26 is connected to the pulse drive input of a search circuit 28, which is operative in response to the comparator output to provide a frequency error correction signal to oscillator 10. More specifically, the search circuit output is applied to the VCO through a resistor 29, which comprises the other arm of the voltage-summing network including resistor 21. Accordingly, the phase error correction signal from low-pass filter 20 and the frequency error correction signal from search circuit 28 are applied to the two inputs of a voltage-summing network comprising resistors 21 and 29 for providing a combined error correction signal at the output of the summing network (the junction of resistors 21 and 29), which is connected to the control circuit of oscillator 10.

Figure 2:
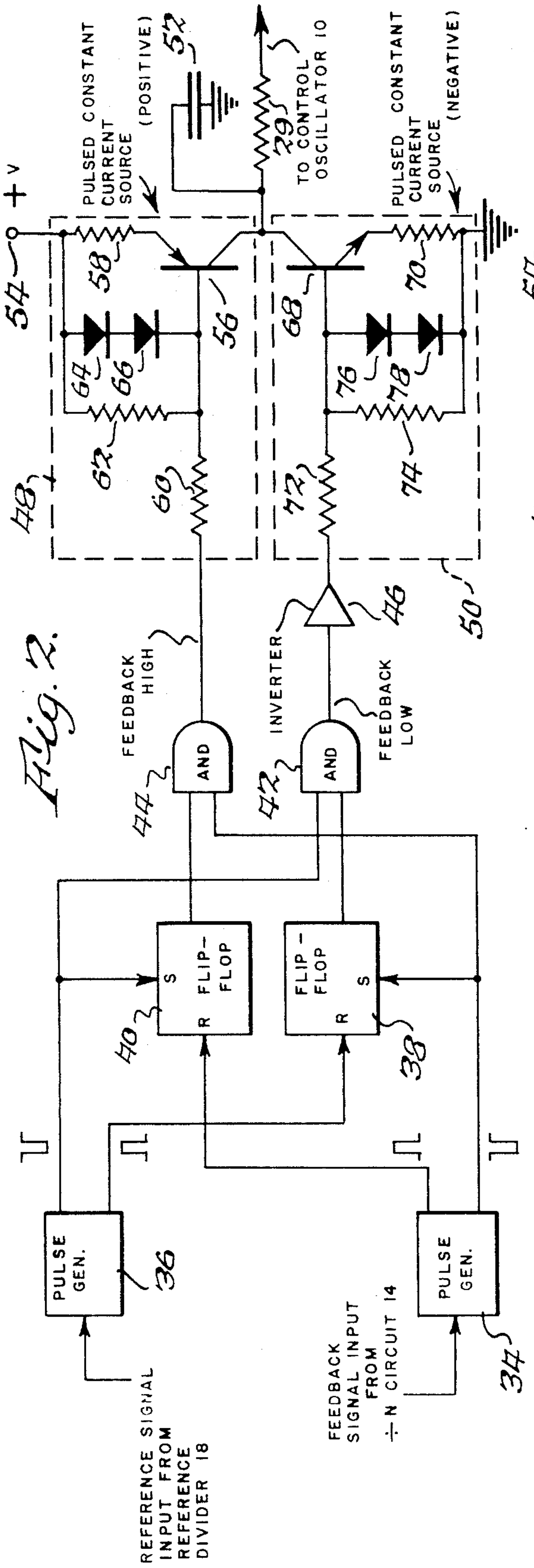
FIG. 2 is a combined block and schematic diagram, the block portion of the diagram illustrating a digital frequency comparator useful in the coarse tuning system of FIG. 1, and the schematic portion of the diagram showing one embodiment of a search circuit in accordance with the invention.

One embodiment of digital frequency comparator 26 is shown in greater detail in the block diagram portion of FIG. 2 and comprises a pair of pulse generators 34 and 36 each of which is operative in response to an input drive pulse to produce a pair of oppositely polarized output pulses, a pair of flip-flops 38 and 40, two AND gates 42 and 44, and an inverter 46 connected at the output of AND gate 42. The inputs of the pulse generators 34 and 36 are the two comparator inputs, the feedback signal pulse train from divide-by-N circuit 14 being applied to the drive input of pulse generator 34 and the reference signal pulse train from the reference divider 18 being applied to the drive input of pulse generator 36. The negative pulse output generator 34 is connected in parallel to the set input of flip-flop 38 and one input of AND gate 44, while the positive pulse output terminal of that pulse generator is connected to the reset input of flip-flop 40. The negative pulse output of generator 36 is connected to the set input of flip-flop 40 and one input of AND gate 42, while its positive pulse output is connected to the reset input of flip-flop 38. The other inputs of AND gates 42 and 44 are respectively connected to flip-flops 38 and 40 in a manner whereby each AND gate is inhibited when its associated flip-flop is in the set condition. This particular embodiment of the comparator provides two outputs to the search circuit, one being the output of AND gate 44 and the other being the output of converter 46.

In operation, the negative pulse produced by the pulse generator 34 in response to an input feedback pulse triggers flip-flop 38 to the set condition to inhibit gate 42 from passing any pulses; this pulse is also fed to gate 44 to be passed therethrough unless blocked by the state of flip-flop 40. The trailing edge of the positive pulse from generator 34 resets flip-flop 40, thereby removing the inhibit on gate 44, and thus setting up a condition whereby the next negative pulse from generator 34 will appear at the output of gate 44 if no pulse is generated by pulse generator 36 between two successive negative pulse from generator 34. This is true because a negative pulse from generator 36, produced in response to an input reference signal pulse, sets the flip-flop 40 to thereby inhibit gate 44 and prevent the next negative pulse from generator 34 from appearing at the output of that AND gate. The generator 36 negative pulse output is also fed to AND gate 42 to be passed therethrough unless flip-flop 38 is in the set condition. The trailing edge of the positive pulse produced by generator 36 resets flip-flop 38 to remove the inhibit signal on gate 42 to allow the next negative pulse from generator 36 to be passed therethrough if flip-flop 38 is not triggered to the set condition by the occurrence of a negative pulse from generator 34 between the two successive negative output pulses of pulse generator 36. Any pulses passed by AND gate 42 are inverted by circuit 46. Hence, the pulses generated at one of the comparator outputs if of opposite polarity with respect to the pulses produced at the other output. More specifically, the output of the comparator represented by AND gate 44 is operative to produce negative pulses, whereas the output of the comparator represented by inverter 46 is operative to produce positive pulses.

Figure 3:
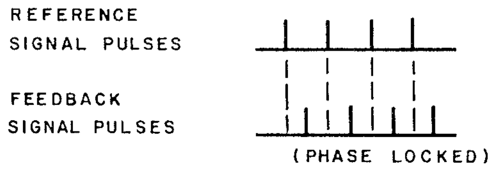
FIG. 3 is a timing diagram illustrating the relationship of the reference and feedback signal pulses when the synthesizer is phase locked.

As has been previously mentioned, when the synthesizer is in phase lock or even approximately phase locked, the reference and feedback signal pulses produced by dividers 18 and 14, respectively, are interlaced in time in an alternating one-to-one manner, as illustrated in FIG. 3. In this pulse interlace condition, the feedback and reference signals applied to the digital comparator (FIG. 2) are operative to set and reset flip-flops 38 and 40 in an alternating manner so that each of the AND gates 42 and 44 are inhibited at the same time a pulse is applied to it. The result is that the comparator will generate no pulse output when the feedback and reference signals are so interlaced.

If the synthesizer frequency error becomes large due to a required change in frequency by the operator, the frequency difference between the feedback and reference signals may well be in excess of the phase detector capture range so that the synthesizer loop would fall out of phase lock. The out-of-lock condition occurs when the frequency disparity between the reference and feedback signals is so large that the respective pulse trains from dividers 18 and 14 are no longer interlaced in a one-to-one alternating manner, as illustrated in FIG. 4.

Figure 4:
FIG. 4 is a timing diagram illustrating the relationship of the reference and feedback signal pulses when the synthesizer is out of lock.

If the VCO frequency error is negative and the feedback signal frequency is lower than the reference signal, two or more reference signal pulses will occur between each of the feedback signal pulses, as shown in FIG. 4. When this condition occurs, the comparator generates output pulses at the difference frequency between the feedback and reference signals. For example, referring to FIGS. 2 and 4, each feedback pulse causes flip-flop 38 to be set, thereby blocking gate 42, and causes flip-flop 40 to be reset. The next pulse input to the comparator is on the reference signal input; this causes pulse generator 36 to produce a negative pulse which will be inhibited by gate 42 but it also produces a positive pulse, the trailing edge of which resets flip-flop 38. Consequently, the next pulse applied to the comparator, which in this instance is also at the reference input, triggers pulse generator 36 to generate a negative pulse which will be allowed through AND gate 42 to be inverted by circuit 46 to a positive pulse at the lower output of the comparator. This last negative pulse also sets flip-flop 40, however, to thereby block the next negative pulse from generator 34 produced by a feedback pulse input. This process continues so as to generate an output pulse from the inverter 46 output of the comparator in response to every other reference pulse applied to the comparator input. Hence, the output pulse train from the comparator is one-half the reference frequency in this illustration, this being the difference frequency between the feedback and reference pulse trains, it being obvious from FIG. 4 that the reference signal pulses are illustrated as occurring at twice the rate of the feedback signal pulses.

If the VCO error is positive and the feedback signal frequency is higher than the reference signal frequency a reverse situation from that shown in FIG. 4 occurs, namely, two or more feedback signal pulses will occur between each of the reference signal pulses. In this event, each reference pulse causes flip-flop 40 to be set, thereby blocking gate 44, and causes flip-flop 38 to be reset. The next pulse input to the comparator is on the feedback signal input; this causes pulse generator 34 to produce a negative pulse which will be inhibited by gate 44, but it also produces a positive pulse, the trailing edge of which resets flip-flop 40. Consequently, the next pulse applied to the comparator, which in this instance is also at the feedback input, triggers pulse generator 34 to generate a negative pulse which will be allowed through AND gate 44 at the upper comparator output. This last negative pulse also sets flip-flop 38, however, to thereby block the next negative pulse from generator 36 produced by a reference pulse input. This process continues so as to generate a negative pulse from the upper comparator output in response to every other feedback pulse applied to the comparator input.

One embodiment of search circuit 28 according to the invention is illustrated by the schematic portion of FIG. 2 as basically comprising a pair of current sources 48 and 50, respectively connected to be pulse controlled by the two comparator outputs represented by AND gate 44 and inverter 46, and a storage capacitor 52 connected between the outputs of both current sources and ground. The output of the search circuit is represented by the junction of capacitor 52 and the outputs of current sources 48 and 50. In the preferred implementation illustrated, circuit 48 is a "positive" constant current source connected to a source of positive supply voltage, represented by terminal 54, and adapted to be activated by and for the duration of each negative pulse applied thereto from AND gate 44; when so activated, current source 48 is operative to increase the charge on storage capacitor 52. Accordingly, when the feedback signal frequency is too high and, as a consequence, negative pulses are produced from gate 44 current source 48 is operative to provide short constant current charge buildups on capacitor 52. As the terminal of capacitor 52 connected to the output of constant current source 48 is also connected via resistor 29 to the control input of oscillator 10, this repeated charging of capacitor 52 produces a stepwise increase in the control voltage applied to the oscillator to thereby reduce the reference and feedback frequency error to a point where phase detector 12 may operate to acquire phase lock.

Circuit 50, on the other hand, is a "negative" constant source connected to ground and adapted to be activated by and for the duration of each positive pulse applied thereto from inverter 46; when so activated, current source 50 is operative to discharge storage capacitor 52. Accordingly, when the feedback signal frequency is too low and, as a consequence, positive pulses are produced from inverter 46, current source 50 is operative to deliver constant current discharges of capacitor 52, thereby producing a stepwise decrease in the control voltage applied to oscillator 10 until phase lock is attained. Hence, the search circuit of FIG. 2 is capable of bidirectional frequency corrective tuning of the oscillator.

When the loop is phase locked, no output pulses will be produced from comparator 26 and both of the inactivated constant current sources 48 and 50 will appear as open circuits. In this state, the charge potential on capacitor 52 "-floats" with the phase detector output, by virtue of the connection via filter 20 and resistors 21 and 29, to track any slow drifts in the system.

There are a variety of ways to implement the described constant current sources, and FIG. 2 shows a transistor embodiment. Circuit 48 comprises a PNP transistor 56 having a collector electrode connected as the output of the current source to capacitor 52, an emitter electrode connected through load resistor 58 to supply voltage terminal 54, and a base electrode connected through resistor 60 to the output of AND gate 44. The base bias circuit for transistor 56 is completed by a resistor 62 connected between the base of the transistor and supply terminal 54. A substantially constant current source is provided when transistor 56 is in the conducting state by a pair of diodes 64 and 66, serially connected in that order between supply terminal 54 and the base of transistor 56 to function as a zener diode.

Circuit 50 includes an NPN transistor 68 having a collector electrode connected to the junction of capacitor 52 and the collector of transistor 56, an emitter electrode connected through load resistor 70 to ground, and a base electrode connected through resistor 72 to the output terminal of inverter 46. A bias resistor 74 is connected between the base of transistor 68 and ground, and a pair of diodes 76 and 78 are serially connected in that order between the base of transistor 68 and ground to provide a substantially constant current source at the collector output of conducting transistor 68.

When the feedback frequency is higher than the reference frequency, so as to produce a negative pulse output from AND gate 44, application of a negative pulse to the base of transistor 56 renders that transistor conducting for the duration of the pulse. The conduction of transistor 56 thereby provides a substantially constant current source for increasing the charge on capacitor 52 during the period of the comparator output pulse. As previously described, a succession of negative pulses applied to the base of transistor 56 are operative to cause successive charge buildups on capacitor 52, and thus provide a stepwise increase in the frequency error correction voltage applied to oscillator 10.

If the feedback frequency is lower than the reference frequency, so as to produce positive output pulses from inverter 46, transistor 68 will be rendered conducting by and for the duration of each positive pulse applied to its base. Conduction of transistor 68 causes a discharge of capacitor 52 to ground for the duration of each pulse from inverter 46. As a result, a succession of positive pulses from inverter 46 produce a succession of short discharges of capacitor 52 and a stepwise decrease in the error correction voltage applied to oscillator 10.

When the oscillator is phase locked, no comparator output pulses will be produced and thus both of the transistors 56 and 68 will be nonconducting, thereby allowing capacitor 52 to float with the output of phase detector 12 as coupled via low-pass filter 20 and resistors 21 and 29.

Figure 5:
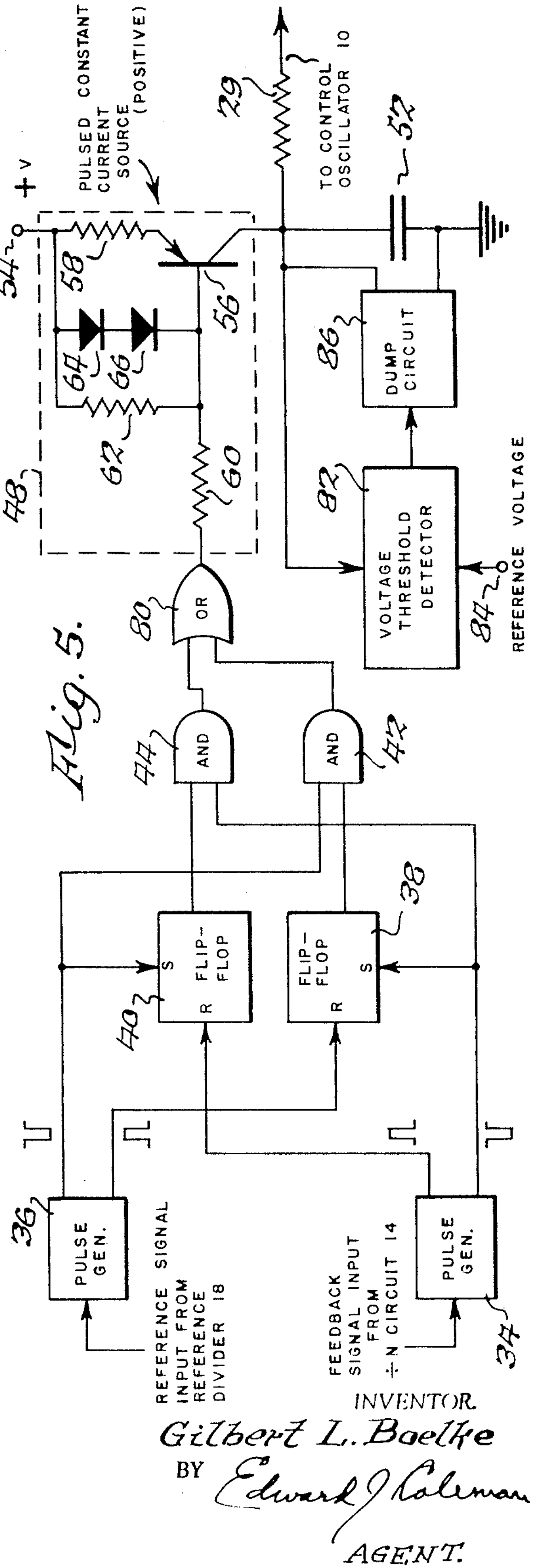
FIG. 5 is a combined block and schematic diagram illustrating an alternative embodiment of a search circuit according to the invention together with an appropriately modified digital frequency comparator.

A unidirectional tuning embodiment of search circuit 28, according to the invention, is shown in FIG. 5. Comparator elements 34, 36, 38, 40, 42 and 44 are employed and operate in the same fashion as described with respect to FIG. 2. In this instance, however, any negative pulses passed by AND gates 42 and 44 are combined together on one comparator output line by an OR gate 80. Thus, the digital frequency comparator 26 of this embodiment has a single output represented by the output of OR gate 80. The search circuit of FIG. 5 employs a single constant current source comprising the same components and operating in the same manner as circuit 48 of FIG. 2 to increase the charge buildup on storage capacitor 52 in response to comparator output pulses. Accordingly, the "-positive" current source of FIG. 5 is labeled as circuit 48, and the components thereof, including the positive supply voltage source 54, are identified with the same numerals as the analogous components of circuit 48 in FIG. 2.

In operation, whether the feedback signal frequency is much higher or much lower than the reference signal frequency, the resulting negative-going pulses from gate 42 or gate 44 are applied via OR gate 80 and resistor 60 to the base of transistor 56. As previously described, each negative pulse renders transistor 56 conducting for the duration of that pulse, and a succession of pulses thereby causes a succession of short constant current charge buildups on capacitor 52. Hence, regardless of the direction of frequency error, the search circuit output signal applied via resistor 29 to control oscillator 10 will comprise a stepwise increase in error correction voltage.

In order to enable recycling of the capacitor 52 storage function, a circuit is provided for discharging capacitor 52 when it reaches a predetermined maximum charge level. More specifically, the search circuit further includes a voltage threshold detector 82, such as a difference amplifier, having a first input connected to the junction of capacitor 52 and the collector of transistor 56, so as to monitor the charge level on the capacitor, and a second input connected to a source of reference voltage represented by terminal 84. The output of detector 82 is connected to the control terminal of a dump circuit 86, which is connected across capacitor 52. The dump circuit may comprise a silicon-controlled rectifier connected across the storage capacitor so that when triggered into conduction by a signal from the threshold detector it rapidly discharges capacitor 52 to ground.

The reference voltage at terminal 84 is selected so that when the charge buildup on capacitor 52 reaches a certain maximum level, the resulting voltage level at the first input of threshold detector 82 will exceed the reference voltage and thereby produce an excedence signal. Dump circuit 86 is thereupon operative in response to the exceedence signal from detector 84 to rapidly discharge capacitor 52. In the discharged state, capacitor 52 is in condition for another charge buildup in the event the frequency error of oscillator 10 is sufficient to cause negative pulses to be produced at the output of comparator OR gate 80.

In summary, a simplified search circuit having decreased current gain and reduced parts cost has been provided for the tuning system of an oscillator. In particular, the search circuit has been described in a typically suitable application in the coarse tuning system of an indirect digital frequency synthesizer, wherein the tuning system includes a digital comparator network for comparing the frequency of feedback and reference pulses and generating output pulses when the feedback and reference pulses are not interlaced. The search circuit is responsive to the frequency comparator output pulses for providing an error correction signal to a controlled oscillator, whereby the oscillator is coarse tuned to within a frequency allowing a phase detector to accomplish phase lock of the feedback pulse train with the reference pulse train. For bidirectional tuning, two outputs are taken from the comparator, the pulses at one output indicating the feedback frequency is lower than the reference frequency and the pulses at the other output indicating the feedback frequency is higher than the reference frequency; the search circuit in this instance comprises a capacitor having two pulse-controlled constant current sources, one of which is responsive to pulses at one of the comparator outputs for charging the capacitor in a stepwise manner, and the other current source being responsive to pulses at the second comparator output for providing stepwise discharging of the capacitor. This bidirectional tuning approach provides a faster lockup time for the phase-locked loop in that the error correction voltage signal always steps in the desired direction, and does not have to proceed through a full cycle and return to a start position.

In some applications, of course, unidirectional tuning may be more advantageous. Accordingly, an alternative embodiment of the invention provides a search circuit which responds to a comparator having only one pulse output. It employs a storage capacitor having a single pulse-controlled constant current source operative in response to the comparator output pulses to stepwise charge the capacitor. Recycling back to the error signal start position is provided by a dump circuit, which discharges the capacitor when it has charged to a predetermined maximum voltage level.

The described search circuit has considerable design flexibility in that the size and number of error correction voltage steps can be changed merely by altering the pulse drive current to transistors 56 and 68, or by changing the value of capacitor 52. For slow drifts in frequency, capacitor 52 follows the phase detector voltage. This represents a significant advantage over prior art search systems, which tend to become erratic in operation in response to slow frequency drifts to the point of proceeding into a full search cycle. As a further advantageous feature, the search circuit of the invention can be designed to provide a more nearly constant loop gain over the search output voltage range and the phase detector output voltage range.

While a particular embodiment of the invention has been illustrated, it will be understood that the applicant does not wish to be limited thereto since modifications will now be suggested to one skilled in the art. For example, the search system described is not limited to use in the type of indirect frequency synthesizer shown in FIG. 1. Also, in FIGS. 2 and 5, it is clear that the polarities can be reversed, whereupon the PNP and NPN transistors would be reversed, and that NAND and NOR circuits can be used in lieu of the AND and OR gates illustrated. Current sources 48 and 50 may be implemented in a variety of ways, and in an appropriate application need not be constant current sources. Storage means other than a capacitor may be employed to perform the charge-discharge function of element 52. Further, the voltage-summing function of resistors 21 and 29 can be implemented by other means, including active elements.

What is claimed is:

1. In a tuning system for an oscillator adapted to be controlled in frequency by a signal applied thereto, said system including a frequency comparator, means for coupling a feedback signal from the output of said oscillator to a first input of said comparator, and means for applying a reference signal to a second input of said comparator, said comparator being operative to generate output pulses when said feedback and reference signals have different frequencies and to generate no pulse output when said feedback and reference signals have substantially the same frequency, a search circuit for providing a control signal to said oscillator in response to the output from said comparator comprising, in combination, a charge storage means, a first current source connected to said storage means and adapted to be activated by and for the duration of each pulse applied thereto, means for coupling output pulses from said comparator to said first current source, and means for coupling said storage means to said oscillator whereby the stored charge functions as a control signal for said oscillator.

2. A search circuit according to claim 1 wherein said first current source is operative when activated to increase the charge in said storage means, and further including means operative when activated to discharge said storage means.

3. A search circuit according to claim 2 wherein said discharge means comprises means for detecting a predetermined maximum charge level in said storage means and producing an output signal indicative of a charge exceeding said maximum level, and a dump circuit connected to said storage means and operative to discharge said storage means in response to a charge exceedence output signal for said detecting means.

4. A search circuit according to claim 2 wherein said first current source is a substantially constant current source.

5. A search circuit according to claim 2 wherein said frequency comparator has two outputs and is operative to generate pulses at one of said outputs when the feedback signal frequency is higher than the reference signal frequency and to generate pulses at the other output when the feedback signal frequency is lower than the reference signal frequency, said means for coupling comparator output pulses to said first current source is connected to couple pulses from only one of the outputs of said comparator, and said discharge means comprises a second current source connected to said storage means and adapted to be activated by and for the duration of each pulse applied thereto, and further including means for coupling pulses from the other output of said comparator to said second current source.

6. A search circuit according to claim 5 wherein said first and second current sources are substantially constant current sources.

7. A search circuit according to claim 1 wherein said charge storage means is a capacitor having first and second terminals, said first current source and said means for coupling said storage means to said oscillator being connected to the first terminal of said capacitor, and the second terminal of said capacitor being connected to a source of reference potential.

8. A search circuit according to claim 7 wherein said first current source includes a first transistor having collector, emitter and base electrodes, a source of supply voltage, means connecting the collector of said first transistor to the first terminal of said capacitor, and means connecting the emitter of said first transistor to said source of supply voltage, the base electrode of said first transistor being connected to said means for coupling output pulses from said comparator.

9. A search circuit according to claim 8 wherein the conduction of said first transistor in response to each pulse applied to its base electrode is operative to increase the charge on said capacitor, and further including a voltage threshold detector having an input connected to the first terminal of said capacitor, and a dump circuit connected across said capacitor and having a control terminal connected to the output of said threshold detector, said threshold detector being operative to produce an exceedence signal at its output when the charge on said capacitor exceeds a predetermined maximum level, and said dump circuit being operative to discharge said capacitor in response to said exceedence signal.

10. A search circuit according to claim 8 wherein said frequency comparator has two outputs and is operative to generate pulses at one of said outputs when the feedback signal frequency is higher than the reference signal frequency and to generate pulses of opposite polarity at the other output when the feedback signal frequency is lower than the reference signal frequency, and said means for coupling comparator output pulses to said first transistor is connected between one of said comparator outputs and the base of said first transistor, and further including a second current source for said capacitor which includes a second transistor having collector, emitter and base electrodes, means connecting the collector of said second transistor to the first terminal of said capacitor, means connecting the emitter of said second transistor to said source of reference potential, and means for coupling pulses from the other output of said comparator to the base of said second transistor.

11. In an indirect frequency synthesizer including an oscillator adapted to be controlled in phase and frequency by signals applied thereto, a digital sampling phase detector having first and second inputs and an output, a frequency divider coupled between the output of said oscillator and the first input of said phase detector for applying a feedback signal thereto, a reference frequency signal source connected to the second input of said phase detector, circuit means connected between the output of said phase detector and said oscillator for providing a phase error correction signal to said oscillator in response to the output from said phase detector, said feedback and reference signals comprising pulse trains and said phase detector being operative to cause said oscillator to be phase corrected toward a condition wherein said feedback pulses are interlaced in time with said reference pulses in an alternating one-to-one manner, a digital frequency comparator having first and second inputs and an output, means coupling the output of said frequency divider to the first input of said comparator for applying said feedback signal thereto, and means connecting said reference frequency signal source to the second input of said comparator, said comparator being operative to generate output pulses when said feedback pulses are not interlaced in time with said reference pulses in an alternating one-to-one manner and to generate no pulse output when said feedback and reference signals are so interlaced, a search circuit for providing a frequency error correction signal to said oscillator in response to the output from said comparator comprising, in combination, a first pulse-controlled current source, a capacitor having a first terminal connected to the output of said first current source and a second terminal connected to a source of reference potential means for coupling output pulses from said comparator to said first current source, said first current source being rendered conducting by and for the duration of each pulse applied thereto, a voltage-summing network having first and second inputs and an output, means connecting the output of said phase detector to the first input of said summing network, means connecting the first terminal of said capacitor to the second input of said summing network, and means connecting the output of said summing network to said oscillator.

12. A search circuit according to claim 11 wherein said first current source is operative when conducting to increase the charge on said capacitor, and further including a voltage threshold detector having an input connected to the first terminal of said capacitor, and a dump circuit connected across said capacitor and having a control terminal connected to the output of said threshold detector, said threshold detector being operative to produce an exceedence signal at its output when the charge on said capacitor exceeds a predetermined maximum level, and said dump circuit being operative to discharge said capacitor in response to said exceedence signal.

13. A search circuit according to claim 11 wherein said first current source is operative when conducting to increase the charge on said capacitor, said digital frequency comparator has two outputs and is operative to generate pulses at one of said outputs when the feedback signal frequency is higher than the reference signal frequency and to generate pulses of opposite polarity at the other output when the feedback signal frequency is lower than the reference signal frequency, and said means for coupling comparator output pulses to said first current source is connected to couple pulses from only one of the outputs of said comparator, and further including a second pulse-controlled current source having an output connected to the first terminal of said capacitor, and means for coupling pulses from the other output of said comparator to said second current source, said second current source being rendered conducting by and for the duration of each pulse applied thereto and being operative when conducting to discharge said capacitor.